United States Patent
Yoon

(10) Patent No.: US 11,551,734 B1
(45) Date of Patent: Jan. 10, 2023

(54) MEMORY DEVICE AND GLITCH PREVENTION METHOD THEREOF

(71) Applicant: Winbond Electronics Corp., Taichung (TW)

(72) Inventor: Minho Yoon, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/382,307

(22) Filed: Jul. 21, 2021

(51) Int. Cl.
- *G11C 8/00* (2006.01)
- *G11C 7/22* (2006.01)
- *G11C 7/10* (2006.01)
- *G11C 8/18* (2006.01)
- *G11C 7/06* (2006.01)

(52) U.S. Cl.
CPC ............ *G11C 7/222* (2013.01); *G11C 7/065* (2013.01); *G11C 7/1039* (2013.01); *G11C 7/1066* (2013.01); *G11C 7/1093* (2013.01); *G11C 8/18* (2013.01)

(58) Field of Classification Search
CPC ..................................................... G11C 7/222
USPC ..................................................... 365/233.1
See application file for complete search history.

(56) References Cited

U.S. PATENT DOCUMENTS

| | | | |
|---|---|---|---|
| 7,715,252 B2 | 5/2010 | Lee | |
| 2003/0031081 A1 | 2/2003 | Suzuki et al. | |
| 2004/0264290 A1* | 12/2004 | Shin | G11C 7/1093 365/233.1 |
| 2012/0218834 A1* | 8/2012 | Kim | G11C 7/1066 365/193 |

* cited by examiner

*Primary Examiner* — Hoai V Ho
(74) *Attorney, Agent, or Firm* — JCIPRNET

(57) ABSTRACT

A memory device and a glitch prevention method thereof are provided. The memory device includes a data strobe signal input circuitry, a transfer signal generating circuitry, a data alignment circuitry, and a blocking circuitry. The data strobe signal input circuitry is configured to input a data strobe signal. The transfer signal generating circuitry is configured to generate a transfer signal with pulses in synchronization with rising edges or falling edges of the data strobe signal in response to a transfer command. The data alignment circuitry is configured to align a data signal to be transferred in response to the generated transfer signal. The blocking circuitry is configured to block an input of the data strobe signal over a postamble timing of the data strobe signal according to a number of bursts counted in each time of data transfer.

12 Claims, 6 Drawing Sheets

MEMORY DEVICE AND GLITCH PREVENTION METHOD THEREOF

BACKGROUND

Field of the Disclosure

The present disclosure relates to a memory device, and more particularly to a memory device and a glitch prevention method thereof.

Description of Related Art

Current double data rate (DDR) synchronous dynamic random access memory (SDRAM) device uses data strobe signal (DQS) for data strobing. The DQS is latched to DRAM by a specific burst length (BL) and a specific pre/post input timing. By strobing the data using the DQS, skew occurring between data and a system clock due to location difference between the system clock and the memory device can be reduced. However, as a clock frequency of the system clock increases, the timing budget is getting tighter and the write postamble related failures occasionally occur in real applications.

FIG. 1 is a timing diagram of a conventional DDR SDRAM. Referring to FIG. 1, in a conventional DDR SDRAM, when a write command is input, the DDR SDRAM receives a data signal DQ together with a data strobe signal generally referred to as DQS. The DQS is used as a clock signal to capture corresponding input data from the data signal DQ. The DQS is amplified to generate an internal DQS, and a data write signal EVEN_D with pulses is generated in synchronization with rising edges of the internal DQS while a data write signal ODD_D with pulses is generated in synchronization with falling edges of the internal DQS. The data write signals EVEN_D and ODD_D are respectively used to capture input data from the data signal DQ. As shown in FIG. 1, when a glitch occurs in the last pulse of the DQS, a falling edge of the internal DQS is mistakenly recognized, and accordingly a width of the data write signal ODD_D generated according to the last falling edge of the internal DQS becomes smaller. As a result, small valid data is captured according to the data write signal ODD_D. Referring to the data DHS1 to DHS8 shown in the lower portion, the aligned data DHS1 and DHS2 are in synchronization with rising edges of the data write signals EVEN_D and ODD_D. Due to the glitch, the values of the aligned data DHS2 are early changed, and accordingly incorrect data is captured.

Accordingly, there is a need to provide a device capable of preventing the write postamble related failures.

SUMMARY

In view of the above, the present disclosure provides a memory device and a glitch prevention method thereof capable of preventing unwanted glitch over postamble timing.

The present disclosure provides a memory device including a data strobe signal input circuitry, a transfer signal generating circuitry, a data alignment circuitry, and a blocking circuitry. The data strobe signal input circuitry is configured to input a data strobe signal. The transfer signal generating circuitry is configured to generate a transfer signal with pulses in synchronization with rising edges or falling edges of the data strobe signal in response to a transfer command. The data alignment circuitry is configured to align a data signal to be transferred in response to the generated transfer signal. The blocking circuitry is configured to block an input of the data strobe signal over a postamble timing of the data strobe signal according to a number of bursts counted in each time of data transfer.

The blocking circuitry comprises a burst counter circuitry configured to count a number of bursts counted from beginning of the data transfer and output a blocking signal for blocking the input of the data strobe signal in response to the counted number of bursts being over a burst length of the memory device.

The burst counter circuitry comprises a first inverter, an asynchronous counter, a first logic circuit, and a second logic circuit. The first inverter is configured to invert the data strobe signal and output an inverted data strobe signal. The asynchronous counter includes a first flip-flop and a second flip-flop. The first flip-flop has a first data terminal, a first clock terminal, and a first asynchronous output terminal, in which the first data terminal is configured to receive a reference signal, and the first clock terminal is configured to receive the inverted data strobe signal. The second flip-flop has a second data terminal, a second clock terminal, and a second asynchronous output terminal, in which the second data terminal is connected to the second asynchronous output terminal, and the second clock terminal is configured to receive an output signal of the first asynchronous output terminal and the reference signal. The first logic circuit is configured to output an enable signal in response to the reference signal and an output signal of the second asynchronous output terminal being enabled. The second logic circuit is configured to output the blocking signal in response to an output signal of the first logic circuit and the inverted data strobe signal being enabled.

The burst counter circuitry further comprises a switch configured to provide a reference signal to the first input terminal in response to a reset signal, in which the reset signal is input to a reset terminal of the first flip-flop and the second flip-flop for resetting data latched in the first flip-flop and the second flip-flop.

Each of the first logic circuit and the second logic circuit comprises an NAND gate and an inverter serially connected.

The burst length comprises one of four, eight and sixteen.

The transfer signal generating circuitry comprises generating a first transfer signal with pulses in synchronization with rising edges of the data strobe signal and generating a second transfer signal with pulses in synchronization with failing edges of the data strobe signal.

The data alignment circuitry comprises synchronously aligning a data signal to be transferred in response to the first transfer signal and the second transfer signal.

The memory device further comprises an amplifier configured to amplifying the data strobe signal.

The present disclosure provides a glitch prevention method of a memory device. In the method, a data strobe signal is first input. A transfer signal with pulses in synchronization with rising edges or falling edges of the data strobe signal is generated in response to a transfer command. A data signal to be transferred is aligned in response to the generated transfer signal. An input of the data strobe signal is blocked over a postamble timing of the data strobe signal according to a number of bursts counted in each time of data transfer.

The postamble timing is a timing from a last failing edge of the data strobe signal corresponding to the data transfer to a next rising edge of the data strobe signal.

The step of blocking an input of the data strobe signal over a postamble timing of the data strobe signal according to a number of bursts counted in each time of data transfer comprises counting a number of bursts counted from beginning of the data transfer and outputting a blocking signal for blocking the input of the data strobe signal in response to the counted number of bursts being over a burst length of the memory device.

The step of generating a transfer signal with pulses in synchronization with rising edges or falling edges of the data strobe signal in response to a transfer command comprises generating a first transfer signal with pulses in synchronization with rising edges of the data strobe signal and generating a second transfer signal with pulses in synchronization with failing edges of the data strobe signal.
The step of aligning a data signal to be transferred in response to the generated transfer signal comprises synchronously aligning a data signal to be transferred in response to the first transfer signal and the second transfer signal.

DESCRIPTION OF EMBODIMENTS

Figure 1:
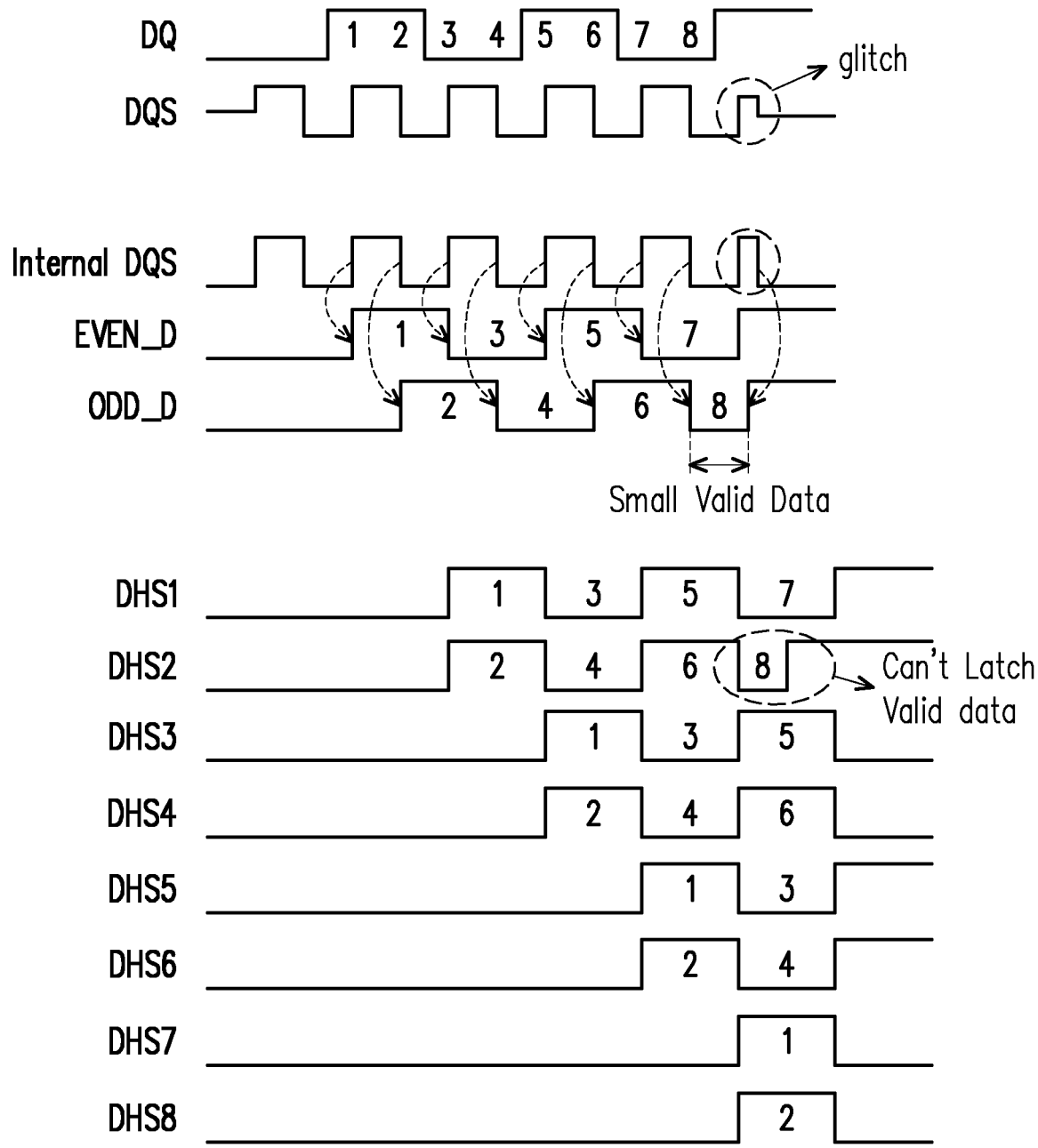
FIG. 1 is a timing diagram of a conventional DDR SDRAM.
Figure 2:
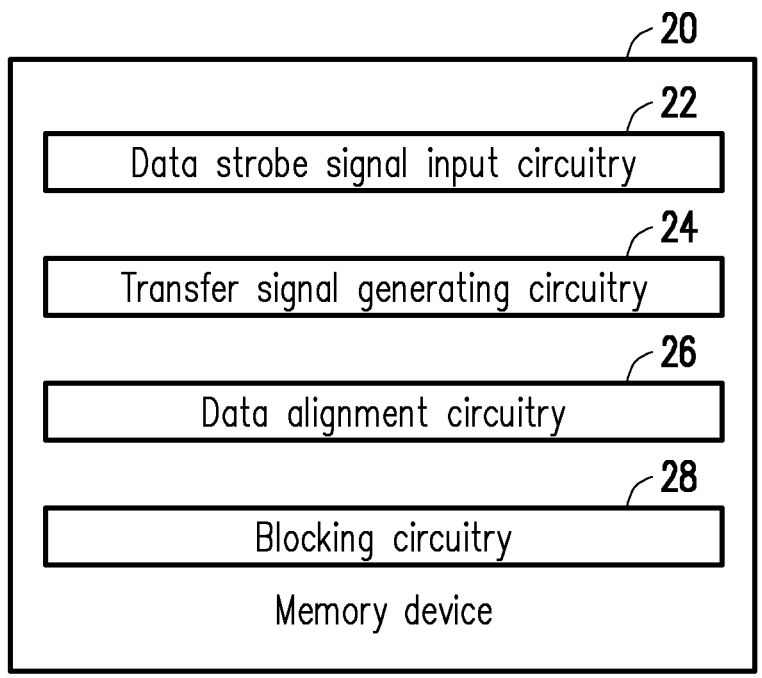
FIG. 2 is a block diagram of a memory device according to an embodiment of the disclosure.

Referring to FIG. 2, the memory device 20 of the embodiment is, for example, a double data rate (DDR) synchronous dynamic random access memory (SDRAM) or a low power DDR (LPDDR) SDRAM that uses data strobe signal (DQS) for data strobing. The memory device 20 includes a data strobe signal input circuitry 22, a transfer signal generating circuitry 24, a data alignment circuitry 26, and a blocking circuitry 28.

In some embodiments, the memory device 20 may further include a command interface for receiving various signals provided by a processor or a controller to facilitate transmission and receipt of data to be written or read from the memory device 20. The received signals include one or more clock signals from an external device. In a DDR memory, a differential pair of clock signals including a true clock signal and a bar clock signal is used, and the clock input circuit may generate an internal clock signal according to the received true clock signal and bar clock signal and supply the internal clock signal to an internal clock generator, such as a delay locked loop (DLL) circuit, for generating a phase-controlled internal clock signal. The phase-controlled internal clock signal is supplied to an I/O interface and used as a timing signal for determining an output timing of data.

To facilitate the data rate within the memory device, data strobe signals, generally referred to as DQS, are used in the memory device such as DDR memory. The DQS are driven by the external processor or controller which sends the data to be written or by the memory device 20 which reads the data, and used as clock signals to capture the corresponding input data. As with the true clock signal and the bar clock signal, the DQS may be provided as a differential pair of data strobe signals so as to provide differential pair signaling during read operations and write operations.

Figure 3:
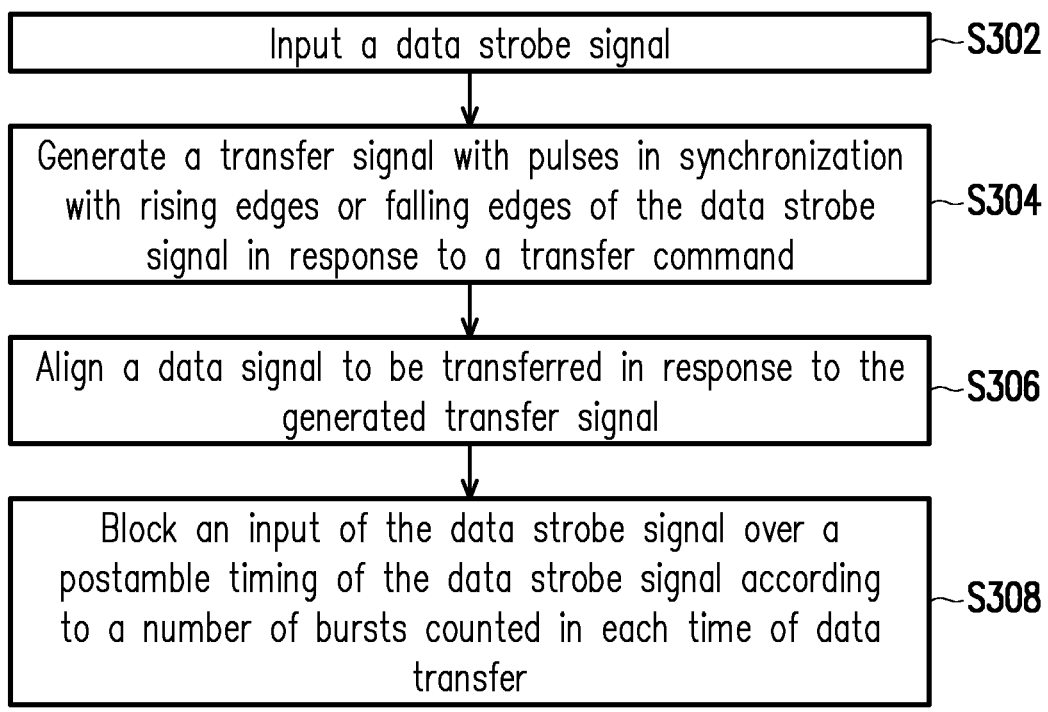
FIG. 3 is a flowchart illustrating a glitch prevention method of a memory device according to an embodiment of the disclosure.

Referring to FIG. 3, the glitch prevention method is adapted for the memory device 20, and the detailed steps of the glitch prevention method of the present embodiment will be described below with reference to the various components of the memory device 20.

First, in step S302, the data strobe signal input circuitry 22 is configured to input a data strobe signal.

Figure 4:
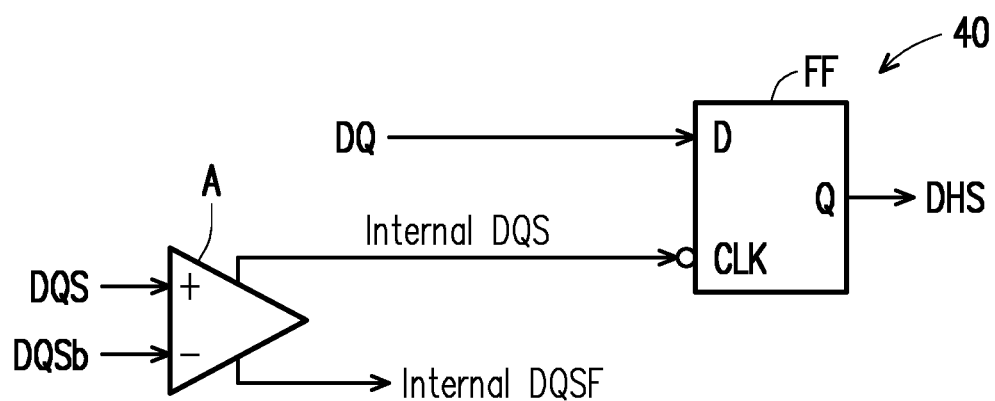
FIG. 4 is a circuit diagram of a memory device according to an embodiment of the disclosure.

Referring to FIG. 4, in a memory device 40, a data strobe signal DQS received from an external device (e.g. processor) may be accompanied by a bar data strobe signal DQSb that is complementary to the data strobe signal DQS. These signals may be transmitted to an amplifier A to generate an internal DQS and a complementary internal DQSF (false data strobe signal). The amplifier A changes the power of the data strobe signal DQS from an external level to a level appropriate for use in the memory device 40.

The internal DQS is used to capture the data signal DQ using a flip flop FF on a correct cycle to successfully begin a write burst and capture incoming write data using the captured write data DHS that is in the DQS domain. The data strobe signal DQS and an external clock signal that generates the data signal DQ may have an unknown phase relationship there between. The phase relationship of the data strobe signal DQS is to be calibrated with respect to an external clock to put the data strobe signal DQS in a position to properly capture the data signal DQ. In some embodiments, the flip flop FF may capture the data signal DQ at the falling edges of the internal DQS. Alternatively, in some embodiments, the flip flop FF may capture the data signal DQ at the rising edges of the internal DQS.

In step S304, the transfer signal generating circuitry 24 is configured to generate a transfer signal with pulses in synchronization with rising edges or falling edges of the data strobe signal in response to a transfer command. The transfer signal generating circuitry 24 may generate a first transfer signal with pulses in synchronization with rising edges of the data strobe signal and generate a second transfer signal with pulses in synchronization with failing edges of the data strobe signal.

In step S306, the data alignment circuitry 26 is configured to align a data signal to be transferred in response to the generated transfer signal. The data alignment circuitry 26 may synchronously align a data signal to be transferred in response to the first transfer signal and the second transfer signal.

In step S308, the blocking circuitry 28 is configured to block an input of the data strobe signal over a postamble timing of the data strobe signal according to a number of bursts counted in each time of data transfer. The postamble timing is, for example, a timing from a last failing edge of the data strobe signal corresponding to the data transfer to a next rising edge of the data strobe signal.

In some embodiments, the blocking circuitry 28 is implemented by a burst counter circuitry that is configured to count a number of bursts from beginning of the data transfer and output a blocking signal for blocking the input of the data strobe signal in response to the counted number of bursts being over a burst length of the memory device. The burst length may be four, eight or sixteen determined according to the type of memory device 20.

Figure 5:
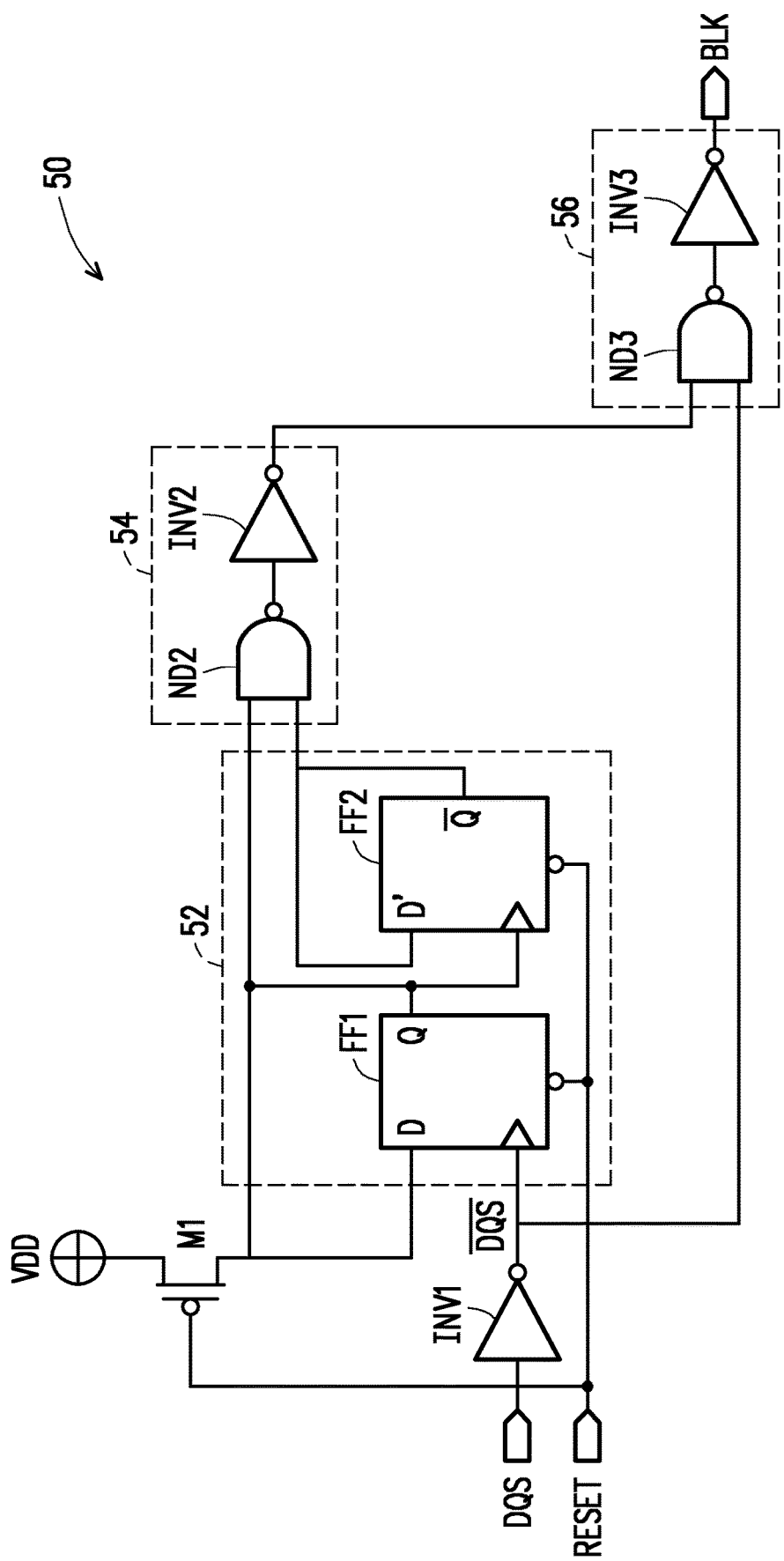
FIG. 5 is a circuit diagram of a burst counter circuitry according to an embodiment of the disclosure.

Referring to FIG. 5, the burst counter circuitry 50 of the present embodiment includes an inverter INV1, an asynchronous counter 52, a logic circuit 54, and a logic circuit 56. The inverter INV1 is configured to invert the data strobe signal DQS and output an inverted data strobe signal $\overline{DQS}$.

The asynchronous counter 52 includes a flip-flop FF1 and a flip-flop FF2. In some embodiments, the flip-flop FF1 and the flip-flop FF2 are D flip-flops, which are not limited herein. The flip-flop FF1 has a data terminal D, a clock terminal, and an asynchronous output terminal Q, in which the data terminal D is configured to receive a reference signal VDD, and the clock terminal is configured to receive the inverted data strobe signal $\overline{DQS}$. The flip-flop FF2 has a data terminal D', a clock terminal, and an asynchronous output terminal $\overline{Q}$, in which the data terminal D' is connected to the asynchronous output terminal $\overline{Q}$, and the clock terminal is configured to receive an output signal of the asynchronous output terminal Q and the reference signal VDD. The logic circuit 54 includes a NAND gate ND2 and an inverter INV2, and is configured to output an enable signal in response to the reference signal VDD and an output signal of the asynchronous output terminal $\overline{Q}$ being enabled. The logic circuit 56 includes a NAND gate ND3 and an inverter INV3, and is configured to output a blocking signal BLK in response to an output signal of the logic circuit 54 and the inverted data strobe signal $\overline{DQS}$ being enabled. In addition, a switch M1 is configured to provide the reference signal VDD to the input terminal D in response to a reset signal RESET, in which the reset signal RESET is input to the reset terminals of the flip-flops FF1 and FF2 for resetting data latched in the flip-flops FF1 and FF2.

Figure 6:
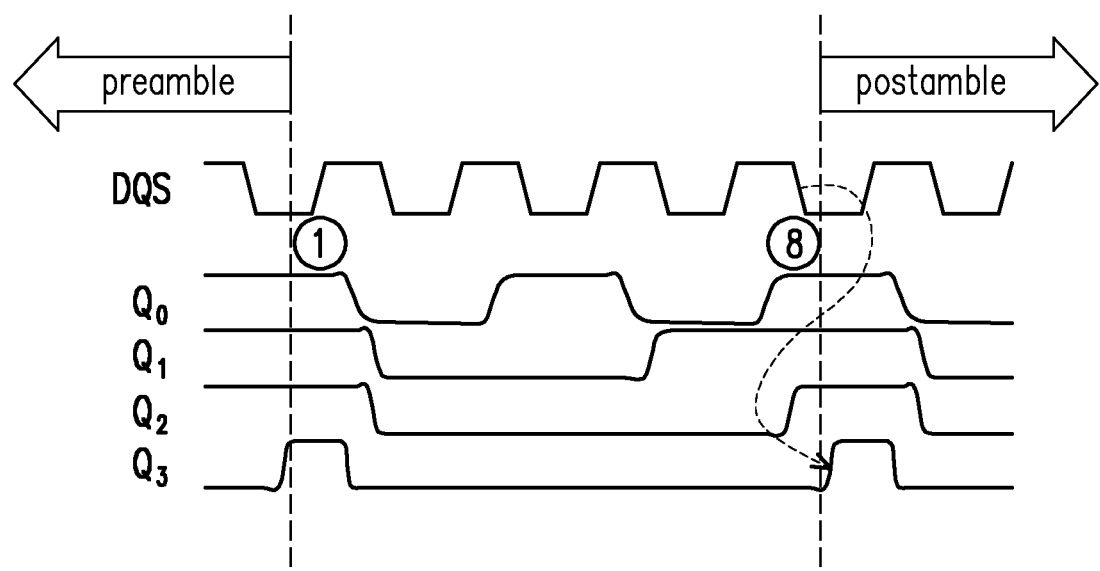
FIG. 6-7 are timing diagrams of a memory device according to the embodiments of the disclosure.

Referring to FIG. 6, the present embodiment illustrates the relation between the data strobe signal DQS and the mode signals $Q_0$ to $Q_3$ of the burst counter circuitry 50 in FIG. 5. The mode signals $Q_0$ to $Q_3$ of the burst counter circuitry 50 are corresponding to different number of bursts counted from the rising edge (denoted as a number of "1") of the data strobe signal DQS. When the number of bursts counted reaches a predetermined value (denoted as a number of "8"), the mode signal $Q_3$ is output and used to block an input of the data strobe signal DQS over a postamble timing of the data strobe signal DQS (i.e. a timing after a last falling edge of the DQS). By using the mode signal $Q_3$ of the burst counter circuitry 50 as the blocking signal, the glitch possibly occurred over the postamble timing of the data strobe signal DQS can be prevented. Compared to the internal delay blocking method, the PVT (process, voltage, temperature) variation impact can be minimized, and fast reaction for the data strobe signal DQS with high frequency can be reached. It is noted, for different types of memory device, the counter to be adopted may vary. For example, for a DDR3 or DDR4 SDRAM, a 8-bit counter is adopted while for a LPDDR4 SDRAM, a 16-bit counter is adopted, alternatively.

Figure 7:
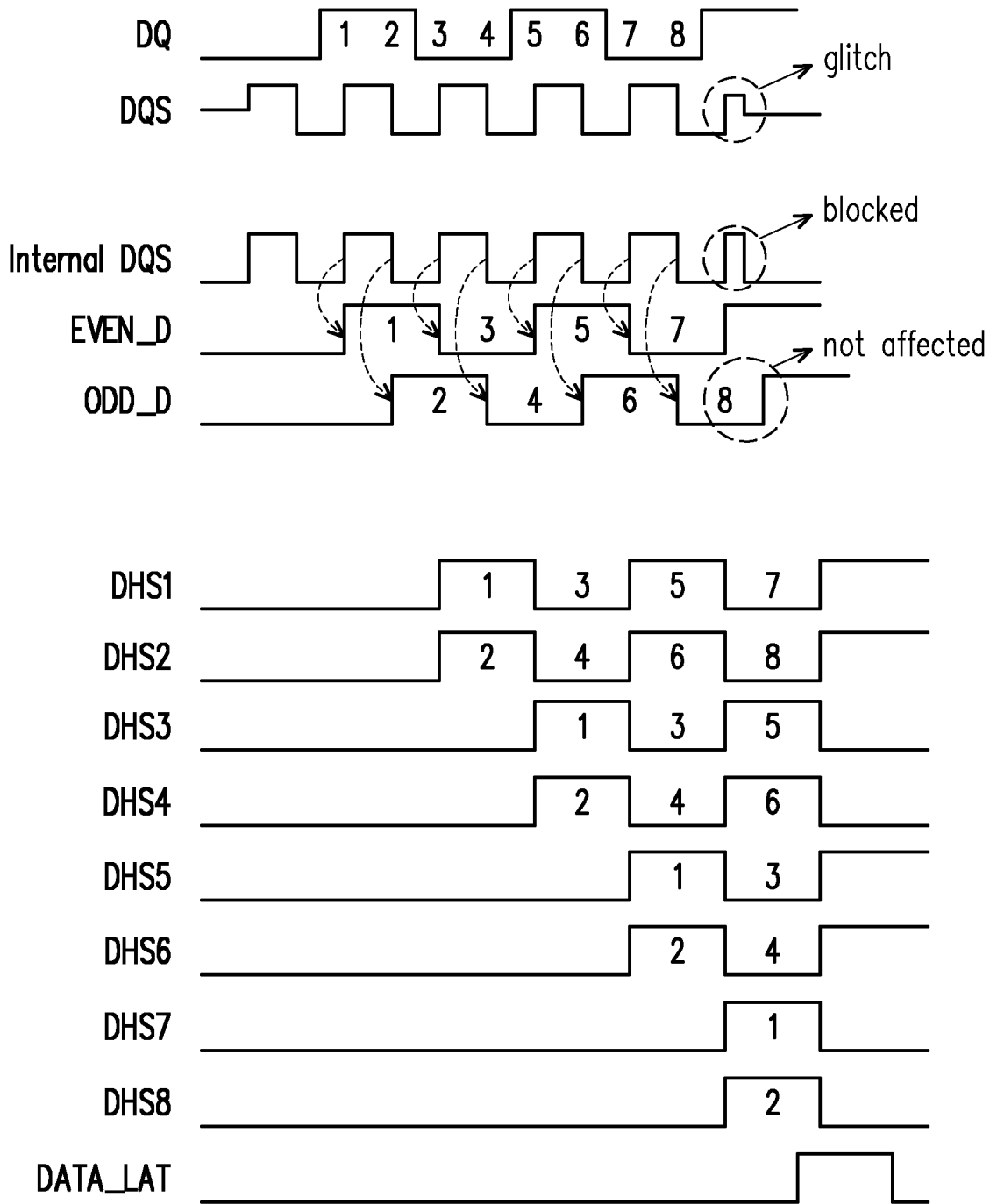

Referring to FIG. 7, in the present embodiment, when a write command is input, the memory device receives a data signal DQ together with a data strobe signal generally referred to as DQS. The DQS is used as a clock signal to capture corresponding input data from the data signal DQ. The DQS is amplified to generate an internal DQS, and a data write signal EVEN_D with pulses in synchronization with rising edges of the internal DQS is generated while a data write signal ODD_D with pulses in synchronization with falling edges of the internal DQS is generated. The data write signals EVEN_D and ODD_D are respectively used to capture input data from the data signal DQ.

As shown in FIG. 7, when a glitch occurs in the last pulse of the data strobe signal DQS, a falling edge of the data strobe signal DQS may be mistakenly recognized. However, through the blocking signal DATA_LAT generated in accordance with the embodiments above, the pulse caused by the glitch in the internal DQS can be blocked and accordingly the data write signals EVEN_D and ODD_D generated according to the rising edges and falling edges of the internal DQS are corrected and used to capture input data from the data signal DQ. Referring to the data DHS1 to DHS8 shown in the lower portion, the aligned data DHS1 and DHS2 are correctly in synchronization with rising edges of the data write signals EVEN_D and ODD_D.

To sum up, according to the embodiments of the present disclosure, a memory device and a glitch prevention method thereof are proposed to make use of counter for programmed burst counting. Based on the counting of the bursts, an input of extended glitch in the data strobe signal over the postamble timing can be prevented, and fast reaction for high frequency data strobe signal can be achieved.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:
1. A memory device, comprising:
a data strobe signal input circuitry configured to input a data strobe signal;
a transfer signal generating circuitry configured to generate a transfer signal with pulses in synchronization with rising edges or falling edges of an internal data strobe signal generated by amplifying the data strobe signal in response to a transfer command;
a data alignment circuitry configured to align a data signal to be transferred in response to the generated transfer signal; and
a blocking circuitry configured to block an input of the data strobe signal over a postamble timing of the data strobe signal according to a number of bursts counted in each time of data transfer, wherein the blocking circuitry comprises:
a burst counter circuitry configured to count a number of bursts counted from beginning of the data transfer and output a blocking signal for blocking the input of the data strobe signal in response to the counted number of bursts being over a burst length of the memory device, wherein the burst counter circuitry comprises:
a first inverter configured to invert the data strobe signal and output an inverted data strobe signal;
an asynchronous counter comprising:
a first flip-flop having a first data terminal, a first clock terminal, and a first asynchronous output terminal, wherein the first data terminal is configured to receive a reference signal, and the first clock terminal is configured to receive the inverted data strobe signal; and
a second flip-flop having a second data terminal, a second clock terminal, and a second asynchronous output terminal, wherein the second data terminal is connected to the second asynchronous output terminal, and the second clock terminal is configured to receive an output signal of the first asynchronous output terminal and the reference signal;
a first logic circuit configured to output an enable signal in response to the reference signal and an output signal of the second asynchronous output terminal being enabled; and a second logic circuit configured to output the blocking signal in response to an output signal of the first logic circuit and the inverted data strobe signal being enabled.

2. The memory device of claim 1, wherein the postamble timing is a timing from a last failing edge of the internal data strobe signal corresponding to the data transfer to a next rising edge of the internal data strobe signal.

3. The memory device of claim 1, wherein the burst counter circuitry further comprises:
a switch configured to provide a reference signal to the first input terminal in response to a reset signal, wherein the reset signal is input to a reset terminal of the first flip-flop and the second flip-flop for resetting data latched in the first flip-flop and the second flip-flop.

4. The memory device of claim 1, wherein each of the first logic circuit and the second logic circuit comprises an NAND gate and an inverter serially connected.

5. The memory device of claim 1, wherein the burst length comprises one of four, eight and sixteen.

6. The memory device of claim 1, wherein the transfer signal generating circuitry comprises generating a first transfer signal with pulses in synchronization with rising edges of the internal data strobe signal and generating a second transfer signal with pulses in synchronization with failing edges of the internal data strobe signal.

7. The memory device of claim 6, wherein the data alignment circuitry comprises synchronously aligning a data signal to be transferred in response to the first transfer signal and the second transfer signal.

8. The memory device of claim 1, further comprising:
an amplifier configured to amplifying the data strobe signal.

9. A glitch prevention method of a memory device, comprising:
inputting a data strobe signal;
generating a transfer signal with pulses in synchronization with rising edges or falling edges of an internal data strobe signal generated by amplifying the data strobe signal in response to a transfer command;
aligning a data signal to be transferred in response to the generated transfer signal; and
blocking an input of the data strobe signal over a postamble timing of the data strobe signal according to a number of bursts counted in each time of data transfer, comprising:
counting a number of bursts counted from beginning of the data transfer and outputting a blocking signal for blocking the input of the data strobe signal in response to the counted number of bursts being over a burst length of the memory device, comprising:
inverting the data strobe signal by a first inverter to generate an inverted data strobe signal;
generating a first output signal by a first flip-flop by inputting a reference signal and the inverted data strobe signal to the first flip-flop;
generating a second output signal by a second flip-flop by inputting the first output signal and the reference signal to the second flip-flop, wherein a data terminal of the second flip-flop is connected to an asynchronous output terminal of the second flip-flop;
generating an enable signal in response to the reference signal and the second output signal being enabled; and
generating the blocking signal in response to the first output signal and the inverted data strobe signal being enabled.

10. The method of claim 9, wherein the postamble timing is a timing from a last failing edge of the internal data strobe signal corresponding to the data transfer to a next rising edge of the internal data strobe signal.

11. The method of claim 9, wherein the step of generating a transfer signal with pulses in synchronization with rising edges or falling edges of the internal data strobe signal in response to a transfer command comprises:
generating a first transfer signal with pulses in synchronization with rising edges of the internal data strobe signal and generating a second transfer signal with pulses in synchronization with failing edges of the internal data strobe signal.

12. The method of claim 11, wherein the step of aligning a data signal to be transferred in response to the generated transfer signal comprises:
synchronously aligning a data signal to be transferred in response to the first transfer signal and the second transfer signal.

\* \* \* \* \*